US005444674A

United States Patent [19]

Sellie

[11] Patent Number: 5,444,674

[45] Date of Patent: Aug. 22, 1995

[54] HAND HELD DECIMAL TIMER WITH IMPROVED FREQUENCY DIVISION

[76] Inventor: Clifford N. Sellie, 320 Sunset Ct., Northbrook, Ill. 60062-5635

[21] Appl. No.: 255,468

[22] Filed: Jun. 8, 1994

[51] Int. Cl.[6] .................... H03K 21/08; G04F 10/04

[52] U.S. Cl. .................... 368/107; 368/201; 377/38; 377/107

[58] Field of Search .................... 377/47, 110, 38; 368/107, 200, 201

[56] References Cited

U.S. PATENT DOCUMENTS

| | | | |
|---|---|---|---|
| 3,202,837 | 8/1965 | Baracket | 377/110 |
| 3,945,194 | 3/1976 | Gollinger | 368/201 |
| 4,185,452 | 1/1980 | Ikeda | 368/107 |
| 4,199,726 | 4/1980 | Bukosky et al. | 368/200 |
| 4,413,350 | 11/1983 | Bond et al. | 377/47 |
| 4,596,027 | 6/1986 | Bernardson | 377/110 |

*Primary Examiner*—John S. Heyman
*Attorney, Agent, or Firm*—Thomas R. Vigil

[57] ABSTRACT

The hand held decimal timer circuit comprises: a power supply having a positive voltage output and a ground or common output; a counter circuit coupled to the power supply; a frequency divider circuit coupled to the counter circuit and to the power supply; a clock circuit including an oscillator coupled to the frequency divider circuit; a display circuit coupled to the counter circuit; a switch circuit coupled to the counter circuit; and, the frequency divider circuit including: (a) a first input for receiving a clock signal from the clock circuit, (b) a second input and a third input for receiving, respectively, a positive voltage reference and a ground voltage reference from the power supply, (c) a 12 bit binary counter which counts the clock cycles from the clock circuit and outputs, on a plurality of output pins, a number of clock cycles in binary form, (d) a pair of NAND gates each having at least three inputs and an output, the inputs being coupled to at least some of the plurality of output pins for receiving, directly and through one or more jumpers between selected ones of the output pins, a number of clock signals, (e) a NOR gate having an output and inputs which are operably coupled to the outputs of the pair of NAND gates for generating a reset signal at the output thereof for resetting the number of clock signals, (f) a capacitor coupled between the NOR gate output and ground for coupling the reset signal to the ground reference voltage to insure the 12 bit binary counter is properly reset when power is applied to the second and third inputs of the frequency divider circuit, (g) an inverter gate having an output and an input operably connected to the output of the NOR gate for generating a count signal at the output of the inverter, and (h) the frequency divider circuit having an output for outputting the count signal; and wherein the frequency of the count signal can be configured to count in one of decimal hours and decimal minutes dependent upon the jumpers connected to which selected ones of the plurality of output pins.

2 Claims, 6 Drawing Sheets

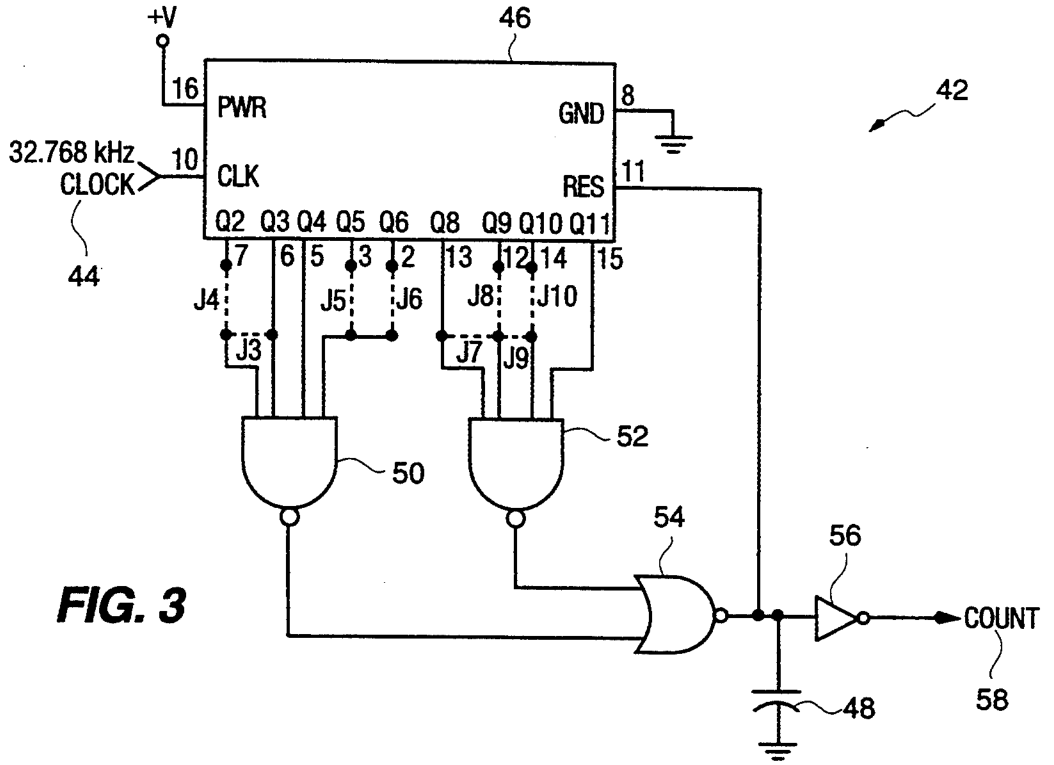
FIG. 3
FIG. 5
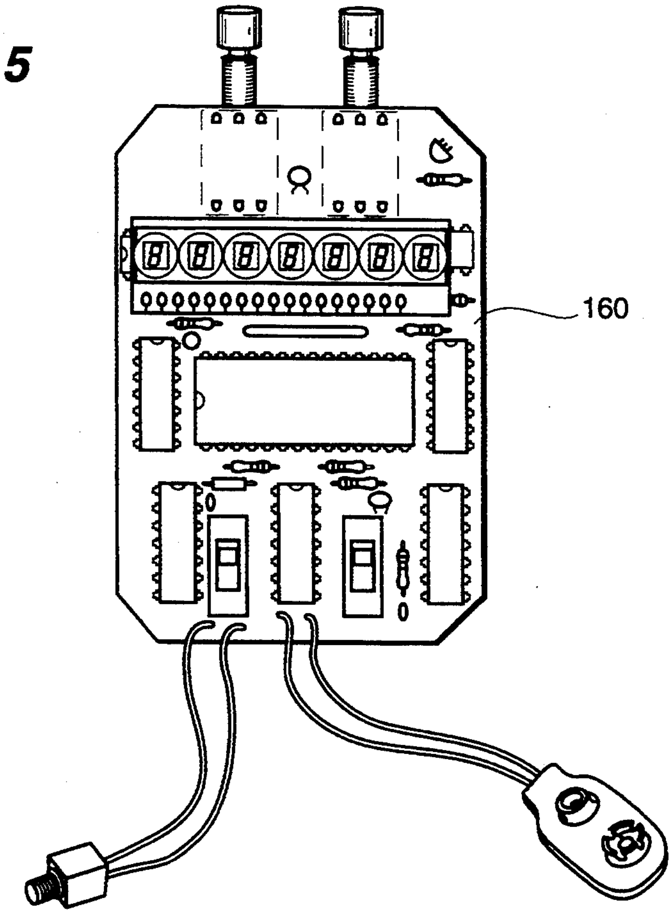

HAND HELD DECIMAL TIMER WITH IMPROVED FREQUENCY DIVISION

BACKGROUND OF THE INVENTION

1. Field of the Invention.

The present invention relates to hand held decimal timers for use in time studies of manufacturing processes.

2. Description of the related art including information disclosed under 37 CFR § 1.97–1.99.

Decimal timers, while similar to stop watches, differ in at least one very important way. A stop watch will typically measure time in the units of hours, minutes and seconds, where a minute is 1/60 of an hour and a second is 1/60 of a minute. Decimal timers come in more than one variety. Two of them being decimal minute timers and decimal hour timers. A decimal minute timer will measure time in only minutes with its fractional portion measured in decimal fractions of a minute. One quarter of a minute on a decimal minute counter will be represented as 0.25. On a stop watch the same quarter of a minute will be represented as 15 seconds. Decimal hour timers will measure time in only hours with its fractional portion measured in decimal fractions of an hour.

Several examples of previously proposed time study systems and timers are disclosed in the following U.S. Patents:

| U.S. Pat. No. | Patentee |
|---|---|
| 3,657,488 | Pountney et al. |
| 4,168,525 | Russell |
| 4,413,277 | Murray |

Time studies of manufacturing processes are methods and tools for analyzing time efficiencies of a given manufacturing process and can be used to evaluate and target proposed changes and modifications in work procedures.

Decimal timers are of significant value in the area of time studies because times observed and recorded are often used in mathematical expressions to assist in the analysis of productivity of a worker. Whether it be for averaging times, for summing times to determine the total time required for a string of events, or any other form of mathematical analysis, the math associated with time studies is easier when the times are kept in decimal form.

FIG. 1 is a block diagram of a hand held decimal timer circuit 10 used in the prior art. The circuit includes a power supply 12, a counter circuit 14, a frequency divider circuit 16, a clock circuit 18, a display circuit 20 and a switch circuit 22.

The power supply 12 provides power to all the hand held decimal timer circuit elements referred to above.

The counter circuit 14 counts at the frequency provided by the frequency divider circuit 16 under the direction of control signals received from the switch circuit 22. It then sends the appropriate display signals to the display circuit 20.

The frequency divider circuit 16 converts a clock signal provided by the clock circuit 18 into a "count" signal at the frequency at which the counter circuit 14 should count.

The clock circuit 18 generates the clock signal for clocking the frequency divider circuit 16.

The display circuit 20 displays the count based on the display signals received from the counter circuit 14.

The switch circuit 22 provides an interface between the user and the counter circuit 14. It generates appropriate control signals for the counter circuit 14 based on the users input.

FIG. 2 illustrates a prior art frequency divider circuit 16 used in the Applicant's prior art hand held decimal timers. The frequency divider circuit 16 alternatively can be configured to function at the needed frequency for either a decimal hour timer or a decimal minute timer.

The frequency divider circuit 16 receives a 32.768 kHz clock signal 24 and this signal is used to clock a 12 bit binary counter 26. The 12 bit binary counter 26 is equivalent to a common digital logic component known in the electrical arts as a 4040. The 12 bit binary counter chip receives a positive supply voltage at pin 16 and is grounded at pin 8. The clock input for the chip, which receives the 32.768 kHz signal, is pin 10. A capacitor 28 is electrically connected to the reset input pin 11 of the 12 bit binary counter 26 to insure that the chip is properly reset on power up. The inputs to NAND gates 30 and 32 are electrically connected to Q3, Q4, Q5, Q8 and Q11 of the 12 bit binary counter 12, i.e., pins 6, 5, 3, 13 and 15 respectively. NAND gates 30 and 32 have their outputs electrically connected to the inputs of NOR gate 34 with the effect that when all the inputs for NAND gates 30 and 32 are active high, the output of NOR gate 34 is low or pulled to ground potential. All the inputs for NAND gates 30 and 32 will be active high when the 12 bit binary counter 26 has a value of 1178 decimal. When the output of NOR gate 34 is low the 12 bit counter 26 is reset, effectively dividing the frequency of the 32.768 kHz clock signal 24 by 1178 and resulting in a signal with a frequency of 27.8 Hz. The 27.8 Hz signal is electrically connected to the input of inverter 36 for the purposes of changing the 27.8 Hz signal from active low at the inverter 36 input to active high at the inverter 36 output. The 27.8 Hz signal is the appropriate frequency for the decimal hour timer. By installing jumper J1, the 27.8 Hz signal will be output to the count output 38.

The 27.8 Hz signal is electrically connected to the clock, pin 4, of the divide-by-N circuit 40. The divide-by-N circuit 40 is equivalent to a common digital logic circuit known in the electrical arts as 4522. The divide-by-N circuit is powered by connecting pin 16 to the positive voltage source and is grounded at pin 8. N is defined by binary encoding the value at pins 5, 11, 14 and 2. Connecting pins 11 and 14 to the positive voltage source and pins 5 and 2 to ground, encodes N as 6 for the divide-by-N circuit 40. The 27.8 Hz signal that is received at pin 4 is divided by 6 and outputted at pin 15. The frequency outputted at pin 15 of the divide-by-N circuit 40 is 4.64 Hz. Installing jumper J2 and removing jumper J1, electrically couples the 4.64 Hz signal to the count output 38. By further subdividing the frequency to 4.64 Hz and moving the decimal point in the display, this has the effect of dividing by 60, the difference between hours and minutes, and generating the appropriate frequency for the decimal minute timer mode, While the above circuit is capable of providing both of the desired frequencies, as will be described in greater detail hereinafter, the hand held timer of the present invention simplifies and reduces the number of parts, and thus the cost and complexity, of the frequency divider circuit to provide a less expensive and simpler hand held decimal hour or minute timer.

SUMMARY OF THE INVENTION

The hand held timer of the present invention provides a simplified frequency divider circuit for decimal timers. This reduces costs and complexity, as well as the number of different parts in the circuit. According to the present invention there is provided a hand held decimal timer circuit comprising:

- a power supply having a positive voltage output and a ground or common output;
- a counter circuit coupled to the power supply;
- a frequency divider circuit coupled to the counter circuit and to the power supply;
- a clock circuit including an oscillator coupled to the frequency divider circuit;
- a display circuit coupled to the counter circuit;
- a switch circuit coupled to the counter circuit; and, the frequency divider circuit including:
  - (a) a first input for receiving a clock signal from the clock circuit,
  - (b) a second input and a third input for receiving, respectively, a positive voltage reference and a ground voltage reference from the power supply,
  - (c) a 12 bit binary counter which counts the clock cycles from the clock circuit and outputs, on a plurality of output pins, a number of clock cycles in binary form,
  - (d) a pair of NAND gates each having at least three inputs and an output, the inputs being coupled to at least some of the plurality of output pins for receiving, directly and through one or more jumpers between selected ones of the output pins, a number of clock signals,
  - (e) a NOR gate having an output and inputs which are operably coupled to the outputs of the pair of NAND gates for generating a reset signal at the output thereof for resetting the number of clock signals,
  - (f) a capacitor coupled between the NOR gate output and ground for coupling the reset signal to the ground reference voltage to insure the 12 bit binary counter is properly reset when power is applied to the second and third inputs of the frequency divider circuit,
  - (g) an inverter gate having an output and an input operably connected to the output of the NOR gate for generating a count signal at the output of the inverter, and
  - (h) the frequency divider circuit having an output for outputting the count signal; and
- wherein the frequency of the count signal can be configured to count in one of decimal hours and decimal minutes dependent upon the jumpers connected to which selected ones of the plurality of output pins.

BRIEF DESCRIPTION OF THE DRAWINGS

FIG. 3 is a circuit diagram of an improved frequency divider circuit to be used with decimal timers constructed according to the teachings of the present invention.

FIG. 5 is a plan view of a circuit board containing the circuit elements illustrated in FIG. 4.

DESCRIPTION OF THE PREFERRED EMBODIMENT(S)

Figure 1:
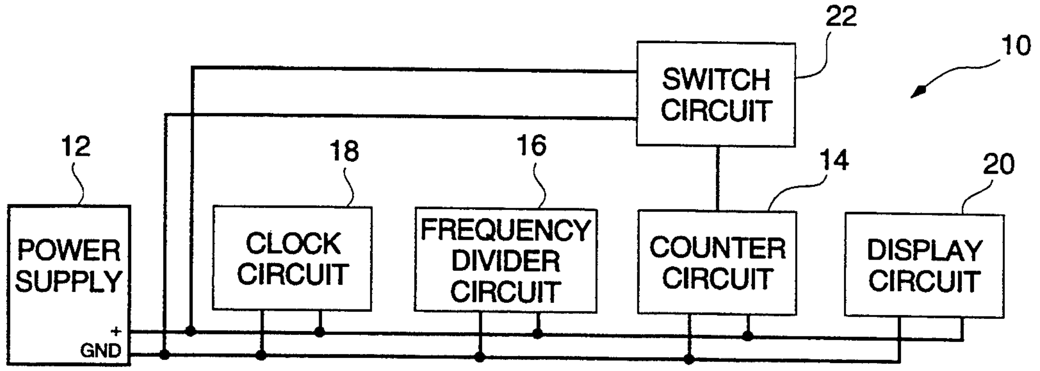
FIG. 1 PRIOR ART
FIG. 1 is a block diagram of a prior art decimal counter.
Figure 2:
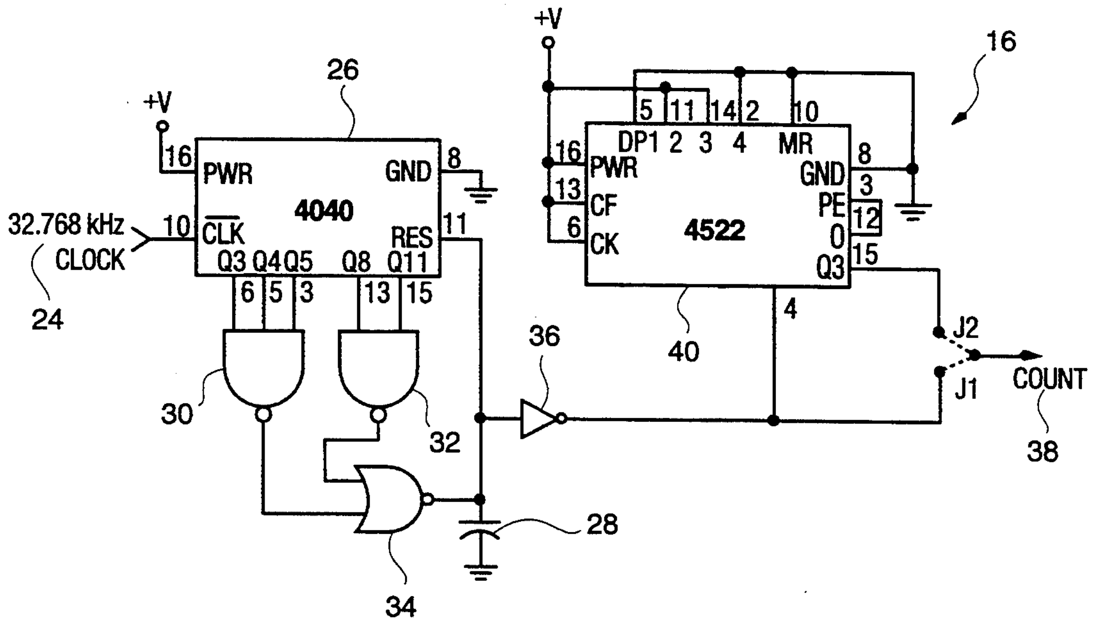
FIG. 2 PRIOR ART
FIG. 2 is a circuit diagram of a prior art frequency divider circuit which is a component of the decimal counter illustrated in FIG. 1.

Referring now to FIG. 3, there is illustrated therein a frequency divider circuit 42 constructed according to the teachings of the present invention. The frequency divider circuit 42 of FIG. 3, similar to the frequency divider circuit 16 of FIG. 2, can be alternatively configured to generate the needed frequency for both a decimal hour timer and a decimal minute timer.

The frequency divider circuit 42 receives a 32.768 kHz clock signal 44 and uses this signal to clock a 12 bit binary counter 46. The 12 bit binary counter 46 is equivalent to a common digital logic component known in the electric arts as a 4040. The 12 bit binary counter chip receives power at pin 16 and is grounded at pin 8. The clock input is pin 10 and this is where it receives the 32.768 kHz clock signal. A capacitor 48 couples the reset input pin 11 of the 12 bit binary counter 46 to ground to ensure that the chip is properly reset on power up.

Jumpers are used to selectively couple the 12 bit count output of the 12 bit binary counter 46 to the inputs of NAND gates 50 and 52. The outputs of the NAND gates 50 and 52 are coupled to inputs of NOR gate 54 such that when all the inputs for NAND gates 50 and 52 are active high, the output of NOR gate 54 is low or pulled to ground potential. The output of NOR gate 54 is electrically connected to the input of the inverter 56. When the output of the NOR gate 54 is low the output of inverter 56 is high and outputted through count output 58, and the reset on the 12 bit binary counter 46 is activated to start the count of the 12 bit binary counter 46 back to zero.

By installing the jumpers J4, J6, J8 and J10 the circuit triggers when the 12 bit binary counter 46 reaches a value of 1966 decimal. This effectively divides the 32.768 kHz frequency to 16.67 Hz, the necessary count frequency for the counter circuit 14 to count in decimal minutes. By installing the jumpers J3, J5, J7 and J9 the circuit triggers when the 12 bit binary counter 46 reaches a value of 1178 decimal, resulting in the 32.768 kHz signal being divided into a frequency of 27.8 Hz, the necessary count frequency for the counter circuit 14 to count in decimal hours.

Figure 4A:
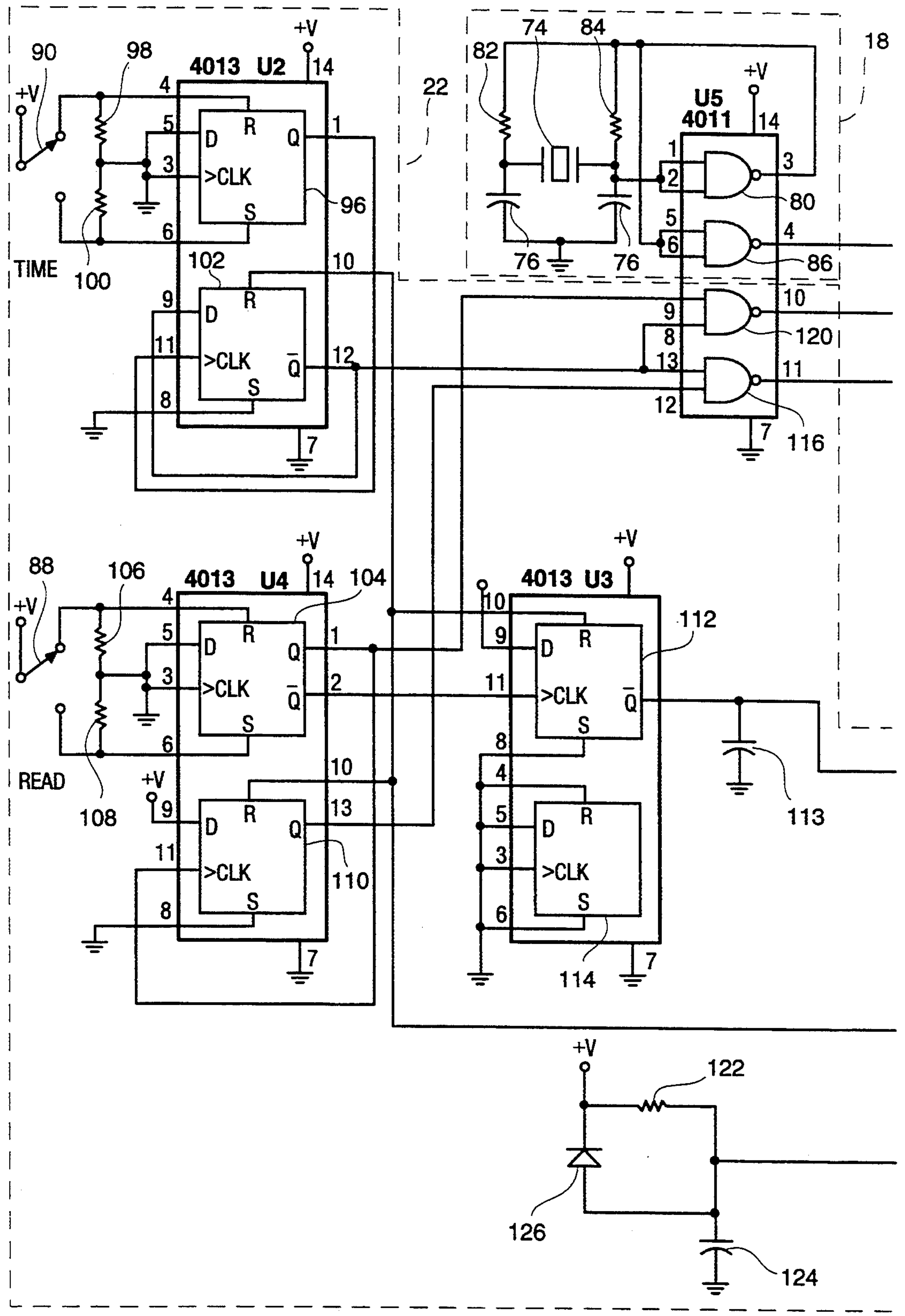
FIG. 4 is a complete circuit diagram of a hand held decimal timer with the improved frequency division constructed according to the teachings of the present invention.
Figure 4B:
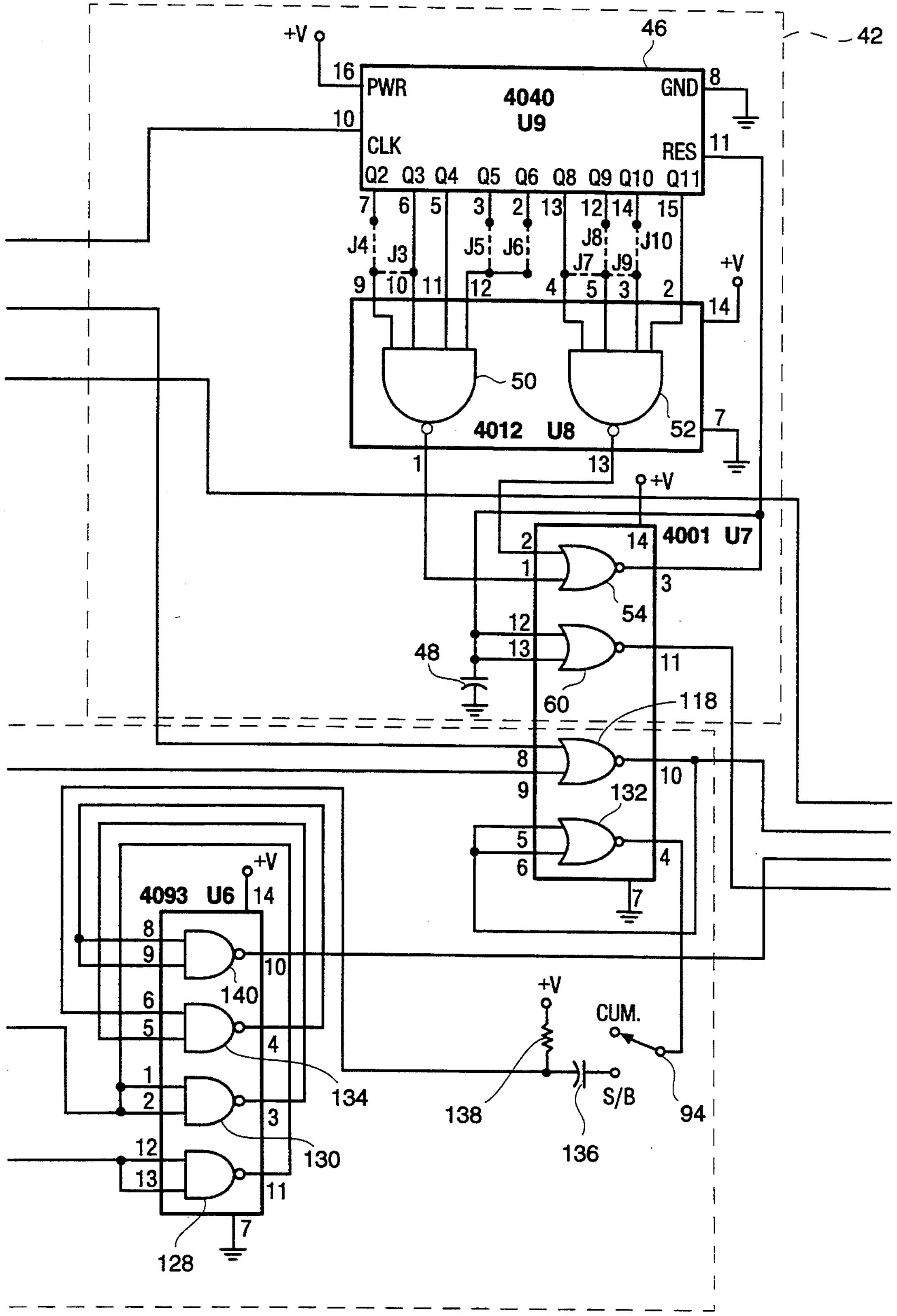
Figure 4C:
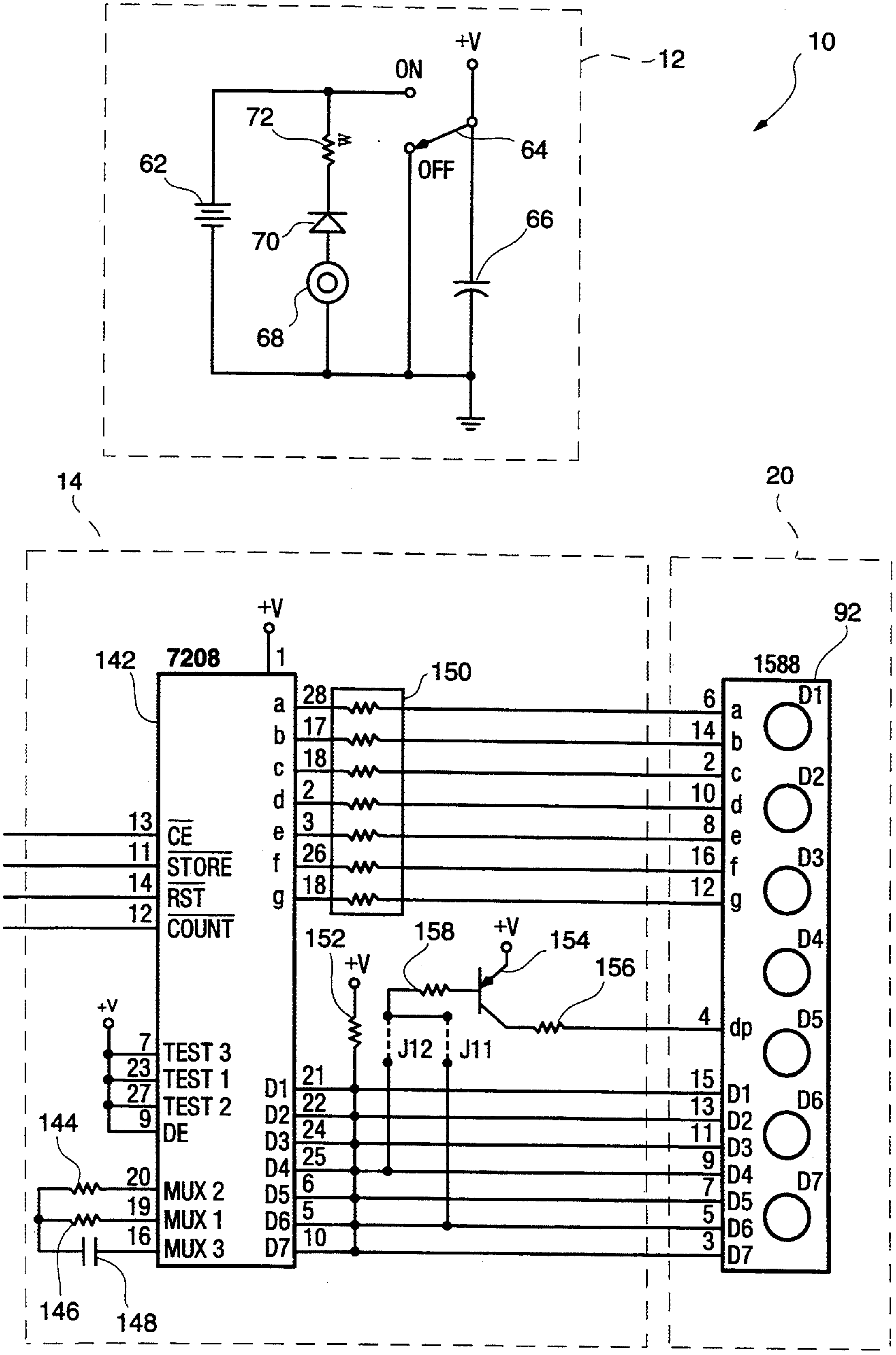

FIG. 4 is a complete circuit diagram of the hand held decimal timer with the improved frequency division constructed according to the teachings of the present invention.

The frequency divider circuit in FIG. 4 differs from the frequency divider circuit 42 of FIG. 3 in only one way. Instead of having the inverter 56 shown in FIG. 3, a NOR gate 60 is used with both of its inputs electrically connected together to act effectively as an inverter.

In addition to the frequency divider circuit 42, the hand held decimal counter circuit 10 shown in FIG. 4 comprises a power supply 12, a counter circuit 14, a clock circuit 18, a display circuit 20, and a switch circuit 22.

The power supply 12 provides power and ground, two source voltages, for providing power to the entire decimal counter circuit 10. Power is provided by a battery 62 and is electrically connected to the rest of the decimal counter circuit 10 through an on/off switch 64. A capacitor 66 is used to help reduce voltage fluctuations. The power supply 12 additionally includes circuitry for charging the batteries. An adapter jack 68 is connected in series with a diode 70 and a resistor 72 with all three elements being in parallel with the battery 62. This circuit allows an external voltage to be supplied through the adapter jack 68 which can then charge the battery 62. The diode 70 protects against the wrong polarity from being supplied to the battery 62 through the adapter jack 68 and prevents current from flowing from the battery 62 into the adapter jack 68.

The clock circuit 18 generates a clock signal used to clock the frequency divider circuit 42. The clock circuit 18 contains an oscillator 74 with two terminals, both terminals coupled to ground through one of a pair of capacitors 76 and 78. Both terminals are similarly coupled to the output of NAND gate 80 through a pair of resistors 82 and 84. The NAND gate 80 is connected in parallel with resistor 84 with its inputs tied together to act like an inverter at one terminal of the oscillator 74. The output of NAND gate 80 is then electrically connected to the inputs of a second NAND gate 86, again with its inputs tied together so as to act as an inverter. This circuit is used to provide a clean clock signal used by the frequency divider circuit 42.

The switch circuit 22 generates the control signals for the counter circuit 14 based on what switches the user presses. Once power has been supplied from the power supply 12, the counter circuit 14 is initially at a value of zero and is not counting. Pressing a read switch 88 will initially start the counter circuit 14. To stop the counter circuit 14 from counting, a time switch 90 must be pressed. To continue the counter circuit 14 counting once started and stopped, the user needs to press the time switch 90, the same switch used to stop the counting. The read switch 88 will only initially start the counter circuit 14 counting. Once the counter circuit 14 is counting, pressing and holding the read switch 88 will freeze the display 92 to show the value of the count circuit 14 when the switch was pressed.

When the read switch 88 is pressed and held, if switch 94 is in cumulative mode, the counter circuit 14 will continue counting from the frozen value even while the display 92 is frozen. If, when the read switch 88 is pressed and held, the switch 94 is in a snap back mode, the value of the counter circuit 14 will be set to zero and it will continue counting while the display 92 is frozen. When the read switch 88 is released, the display circuit 20 will display the current value of the count circuit 14.

D flip-flop 96 has its data input and clock input electrically connected to ground and effectively behaves as a set/reset latch for the purpose of debouncing the time switch 90. Both the set input and the reset input are weakly coupled to ground through one of a pair of resistors 98 and 100. Both the set input and the reset input are electrically connected to opposite sides of the noncommon terminals of time switch 90. The common pole of the reset switch 90 is electrically connected to the positive voltage source. The time switch 90 is normally positioned electrically connected to the reset input of the D flip-flop 96 resulting in an output Q that is normally low. The Q output of D flip-flop 96 is set when the time switch 90 is pressed. The output Q of D flip-flop 96 is electrically connected to the clock input of D flip-flop 102. D flip-flop 102 has its data input connected to its $\overline{Q}$ output so that, when it is clocked, the logic value at $\overline{Q}$ toggles to the opposite logic state, e.g. 1 to 0.

Similar to D flip-flop 96, D flip-flop 104 acts to debounce the read switch 88. D flip-flop 104 has its data input and clock input electrically connected to ground with both reset input and set input coupled weakly to ground through one of a pair of resistors 106 and 108. Both set input and reset input of D flip-flop 104 are electrically connected to opposite sides of the noncommon terminals of read switch 88. The common terminal of the read switch 88 is connected to the positive voltage source. The output Q of D flip-flop 104 is electrically connected to the clock input of D flip-flop 110. D flip-flop 110, instead of toggling as D flip-flop 102 described above, latches and holds when read switch 88 is pressed. The D flip-flop 104 is electrically connected to a second D flip-flop 112 through its D flip-flop 102 and has its data input connected to its $\overline{Q}$ output so that when it is clocked, the logic value at $\overline{Q}$ toggles to the opposite logic state, e.g. 0 to 1. The $\overline{Q}$ output of D flip-flop 112 is coupled to ground through capacitor 113. The $\overline{Q}$ output latches and holds when read switch 88 is released. D flip-flop 114 is a spare circuit with its inputs electrically connected to the ground source to inactivate it and prevent unnecessary power consumption.

NAND gate 116 has its inputs electrically connected to $\overline{Q}$ of D flip-flop 102 and Q of D flip-flop 110 and generates the control signal "count-enable" at its output.

NOR gate 118 has its inputs electrically connected to $\overline{Q}$ of D flip-flop 112 and the output of NAND gate 120. NAND gate 120 has its inputs electrically connected to Q of D flip-flop 104 and $\overline{Q}$ of D flip-flop 102. A control signal "store" is generated at the output of NOR gate 118.

Resistor 122 connected in series with capacitor 124 couples the positive voltage source to the ground source to create a delay circuit to generate a reset signal shortly after the power is connected. Diode 126 is connected in parallel with resistor 122 to provide over voltage protection. A delay signal, existing at the connection between resistor 122 and capacitor 124, is used as an input to a Schmitt trigger 128. The output of Schmitt trigger 128 is electrically connected to the reset input of D flip-flops 102, 110 and 112 to guarantee their proper state when power is applied. The output of the Schmitt trigger 128 is electrically connected to the Schmitt trigger 130 which inverts the polarity and makes the signal active high.

The output of NOR gate 118 is electrically connected to both inputs of NOR gate 132, acting as an inverter to generate the complement of control signal "store". The compliment of the "store" signal will be coupled to the first input of a Schmitt trigger 134 through the switch 94 and capacitor 136, if the decimal counter circuit 10 is in the snap back mode. Otherwise, the first input of the Schmitt trigger 134 will be controlled through the weakly coupled resistor 138 to the positive voltage source. The second input of the Schmitt trigger 134 is coupled to the output of the Schmitt trigger 130 to generate the complement of the control signal "reset". The output of the Schmitt trigger 134 is coupled to both inputs of the Schmitt trigger 140 to generate the control signal "reset" of the correct polarity.

The counter circuit 14 receives the control signals and generates the display signals. The counter circuit 14 is composed primarily by a counter chip 142 that in the electrical arts is known as a 7208 available off the shelf. The counter chip 142 includes a counter and display drivers. Power is supplied to the chip by electrically connecting the positive voltage source to pin 1 and ground potential to pin 4. The frequency at which the display is updated is controlled by an RC circuit connected to pins 16, 19 and 20. A resistor 144 has its first terminal electrically connected to pin 20. A resistor 146 has its first terminal electrically connected to pin 19. The capacitor 148 has its first terminal electrically connected to pin 16. The second terminals of resistors 144 and 146 and capacitor 148 are electrically connected together.

Test pins 7, 23, 27 and display enable pin 9 are electrically connected to the positive voltage source. The control signals "count-enable", "store", "reset", and "count" are connected respectively to pins 13, 11, 14 and 12.

The display driver signals for the display segments a through g, located at pins 28, 17, 15, 2, 3, 26 and 18, respectively, are coupled to the display circuit 20 through resistor network 150. Display driver signals D1 through D7 located at pins 21, 22, 24, 25, 6, 5 and 10, respectively, are coupled directly to the display circuit 20. Display driver signals D1 through D7 are each individually coupled weakly to the positive voltage source through its own resistor contained in resistor network 152. This prevents a given display from sinking current when it is not enabled. The decimal point is driven by a transistor 154 with its collector electrically coupled to the positive voltage source and its emitter coupled to the display circuit through resistor 156. The location of the decimal point is determined by coupling the base of transistor 154 through resistor 158 and one of two jumpers and J12. If J11 is installed the decimal point will be present at the sixth numeric position by coupling the base of transistor 154 to display signal D6, which is where it should be positioned for the timer counting in decimal hours. If J12 is installed the decimal point will be present at the fourth numeric position by coupling the base to display signal D4, which is where it should be positioned for the timer counting in decimal minutes.

The display circuit 20 is an off the shelf LED display known in the electrical arts as a 1588. The display 1588 directly receives the display signals from the counter circuit 14 and displays the count. Signals a through g are electrically connected at pins 6, 14, 2, 10, 8, 16 and 12, respectively. Signals D1 through D7 are electrically connected at pins 15, 13, 11, 9, 7, 5 and 3, respectively. The decimal point signal is electrically connected to pin 4.

FIG. 5 is a plan view of a circuit board 160 containing the electrical circuit shown in FIG. 4.

Figure 6:
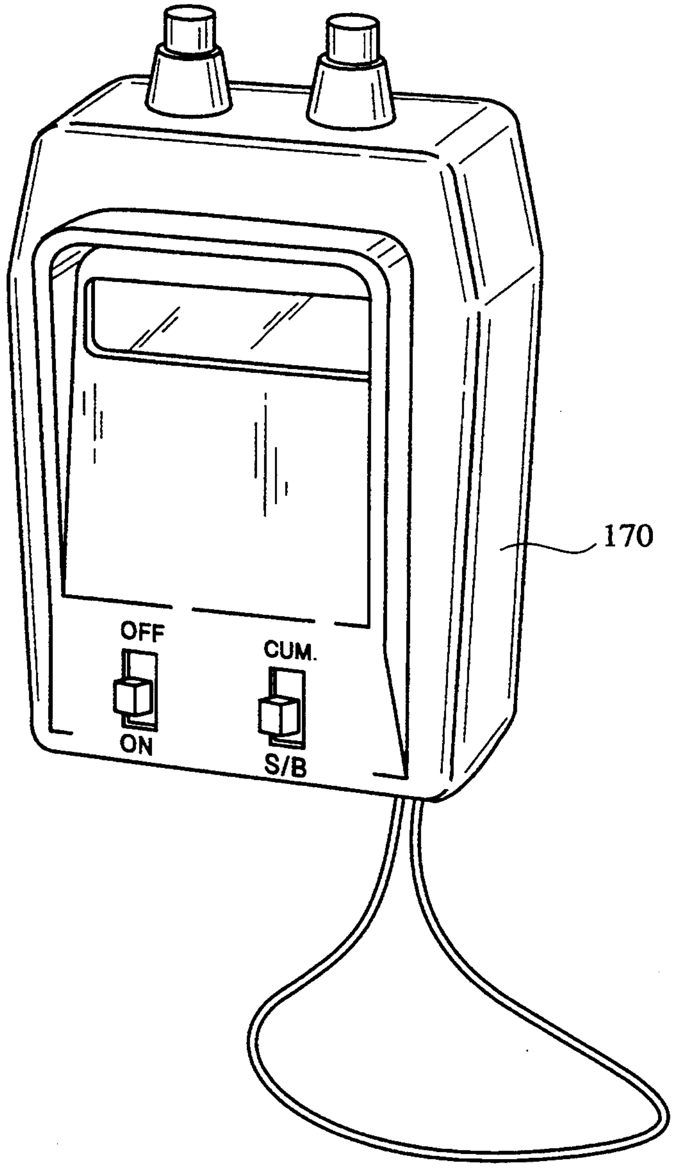
FIG. 6 is a top perspective view of a hand held timer in which the circuit board shown in FIG. 5 can be mounted.

FIG. 6 is a perspective view of a hand held decimal timer 170 having the circuit board 160 shown in FIG. 5 mounted therein.

From the foregoing description, it will be apparent that the hand held decimal timer with improved frequency division of the present invention has a number of advantages, some of which have been described above and others of which are inherent in the invention.

The construction of the circuit board 160 permits wave soldering instead of hand soldering avoiding poor connections and permitting wire leads of components to be trimmed closer to the circuit board 160. The new design provides a better quality product, needing fewer repairs and longer life.

Also it will understood that modifications can be made to the hand held decimal timer with improved frequency division described above without departing from the teachings of the present invention. Accordingly, the scope of the invention is only to be limited as necessitated by the accompanying claims.

I claim:

1. A hand held decimal timer circuit comprising:

a power supply having a positive voltage output and a ground or common output;

a counter circuit coupled to said power supply;

a frequency divider circuit coupled to said counter circuit and to said power supply;

a clock circuit including an oscillator coupled to said frequency divider circuit;

a display circuit coupled to said counter circuit; a switch circuit coupled to said counter circuit; and, said frequency divider circuit including:

(a) a first input for receiving a clock signal having a frequency of approximately 32.768 kHz from said clock circuit, (b) a second input and a third input for receiving, respectively, a positive voltage reference and a ground voltage reference from said power supply, (c) a 12 bit binary counter which counts the clock cycles from said clock circuit and outputs, on a plurality of output pins, a number of clock cycles in binary form, (d) a pair of NAND gates each having at least three inputs and an output, said inputs being coupled to at least some of said plurality of output pins for receiving, directly and through one or more jumpers between selected ones of said output pins, a number of clock signals, (e) a NOR gate having an output and inputs which are operably coupled to said outputs of said pair of NAND gates for generating a reset signal at said output thereof for resetting said number of clock signals, (f) a capacitor coupled between said NOR gate output and ground for coupling said reset signal to the ground reference voltage to insure the 12 bit binary counter is properly reset when power is applied to said second and third inputs of said frequency divider circuit, (g) an inverter gate having an output and an input operably connected to said output of said NOR gate for generating a count signal at said output of said inverter, (h) said frequency divider circuit having an output for outputting said count signal, and, (i) the frequency of said count signal being configured to count in decimal minutes by the connection of jumpers to selected ones of said plurality of output pins, said plurality of output pins including eleven pins and said jumpers being selected and connected in such a manner to the output pins for supplying the second, third, fourth, sixth, eighth, ninth, tenth and eleventh bits of the number of clock cycles counted to the inputs of the pair of NAND gates whereby said hand held decimal timer circuit will count in decimal minutes.

2. A hand held decimal timer circuit comprising:

a power supply having a positive voltage output and a ground or common output;

a counter circuit coupled to said power supply;

a frequency divider circuit coupled to said counter circuit and to said power supply;

a clock circuit including an oscillator coupled to said frequency divider circuit;

a display circuit coupled to said counter circuit;

a switch circuit coupled to said counter circuit; and, said frequency divider circuit including:

(a) a first input for receiving a clock signal having a frequency of approximately 32.768 kHz from said clock circuit, (b) a second input and a third input for receiving, respectively, a positive voltage reference and a ground voltage reference from said power supply, (c) a 12 bit binary counter which counts the clock cycles from said clock circuit and outputs, on a plurality of output pins, a number of clock cycles in binary form, (d) a pair of NAND gates each having at least three inputs and an output, said inputs being coupled to at least some of said plurality of output pins for receiving, directly and through one or more jumpers between selected ones of said output pins, a number of clock signals, (e) a NOR gate having an output and inputs which are operably coupled to said outputs of said pair of NAND gates for generating a reset signal at said output thereof for resetting said number of clock signals, (f) a capacitor coupled between said NOR gate output and ground for coupling said reset signal to the ground reference voltage to insure the 12 bit binary counter is properly reset when power is applied to said second and third inputs of said frequency divider circuit, (g) an inverter gate having an output and an input operably connected to said output of said NOR gate for generating a count signal at said output of said inverter, (h) said frequency divider circuit having an output for outputting said count signal, and, (i) the frequency of said count signal being configured to count in decimal hours by the connection of jumpers to selected ones of said plurality of output pins, said plurality of output pins including eleven pins and said jumpers being selected and connected in such a manner to the output pins for supplying the third, fourth, fifth, eighth and eleventh bits of the number of clock cycles counted to the inputs of the pair of NAND gates whereby said hand held decimal timer will count in decimal hours.

* * * * *